United States Patent [19]

Masters

[11] 4,180,203
[45] Dec. 25, 1979

[54] PROGRAMMABLE TEST POINT SELECTOR CIRCUIT

[75] Inventor: Harvey M. Masters, Ellicott City, Md.

[73] Assignee: Westinghouse Electric Corp., Pittsburgh, Pa.

[21] Appl. No.: 838,262

[22] Filed: Sep. 30, 1977

[51] Int. Cl.² .................. G06F 11/04; G01R 31/00
[52] U.S. Cl. .................................. 235/302; 324/73 R
[58] Field of Search .......................... 235/302, 304.1; 324/73 R, 73 AT

[56] References Cited

U.S. PATENT DOCUMENTS

| | | | |
|---|---|---|---|
| 3,764,995 | 10/1973 | Helf, Jr. et al. | 324/73 R X |
| 3,772,595 | 11/1973 | DeWolf et al. | 324/73 R |
| 3,849,726 | 11/1974 | Justice | 324/73 R |
| 3,892,954 | 7/1975 | Neuner | 235/302 |
| 3,927,371 | 12/1975 | Pomeranz et al. | 235/302 X |

Primary Examiner—Jerry Smith
Attorney, Agent, or Firm—J. B. Hinson

[57] ABSTRACT

A programmable test point selector circuit for interfacing a test set with a system to be tested is disclosed. Typically, the system to be tested is provided with a multi-pin connector or receptacle to which the automatic test set is connected. The disclosed programmable test point selector circuit is interposed between the test set and this connector. Digital program words from the test set are used to designate pins of the multi-pin connector for use as either an input pin or an output pin. Additionally, the programmable test point selector permits at least one voltage level of the digital signal supplied to any pin designated as an input to be independently programmed over a wide range of values. An output sensing circuit is also provided which permits any individual pin or group of pins to be selected for monitoring to determine the voltage level of the signal present at the selected output pin relative to a threshold level. The threshold level of the output sensing circuit is also programmable so that each output pin of the device being tested may be monitored for the correct level. Thus, the device under test can have a mixture of voltage levels on its output pins. The program to the programmable test point selector circuit is a series of digital signals supplied by the associated test system.

2 Claims, 2 Drawing Figures

PROGRAMMABLE TEST POINT SELECTOR CIRCUIT

BACKGROUND OF THE INVENTION

1. Field of the Invention

The invention relates to test systems and more specifically to a programmable test point selector circuit which permit the pins of the connector used to interface a general purpose test set with the system to be tested to be programmed as either multivoltage stimuli (input) or multivoltage measurement (output) points.

2. Description of the Prior Art:

Typical prior art general purpose test sets provide a predetermined number of pins which were permanently designated for signal inputs (stimuli points) and another number of pins that were permanently allocated to outputs (measurement points). In utilizing these systems, adapters were built to interface the test set with the system to be tested. The disadvantages of this arrangement were that there was no capability of redistributing the available pins between inputs and outputs, and each specific system to be tested required its own specially designed interface adapter to mate the test set with the system being tested. These test sets normally applied and measured only one level of signal voltage. If some pins designated as inputs required different voltage levels or if the voltage appearing on any pin designated as an output required a different threshold value, special circuitry was normally designed into the unique adapter and the problem resolved in this manner rather than in the test set.

Other prior art test systems utilized relay networks to couple input signals to terminals designated by a program as inputs and to couple the terminals designated by a program as outputs to the test set. These systems tend to be slow due to the operating times of the relays and also have the reliability and electrical noise problems inherent in electromechanical components. Additionally, these systems did not provide means for selecting mixed multivoltage levels to be used as input signals or means for programming the threshold for pins designated as outputs.

SUMMARY OF THE INVENTION

This application discloses a programmable test point selector circuit which may be an integral part of the test set, or a separate circuit. In either case, the programmable test point selector circuit is coupled to the test set and to the system to be tested. For convenience, these connections are usually provided by detachable multi-pin connectors.

The programmable test point selector circuit is responsive to a program from the associated test set permitting any pin (test point) of the multi-pin connector attached to the system to be tested to be utilized as either an input or an output. Additionally, the voltage levels of input signals coupled to specific pins can be programmed individually. The threshold level used to determine the status of the signal present at a pin designated as an output relative to the threshold level can also be individually programmed.

The program which controls the operation of the programmable test point selector circuit is a series of multi-bit digital words. As the associated test system cycles through a predetermined number of test steps, a predetermined series of these multi-bit digital program words will be generated by the associated test set. Each of these multi-bit digital words designates the pins of the multi-pin connector to be used for input signals, the pins of the multi-pin connector to be used for output signals, the signal voltage level of each input signal and the threshold level associated with each output signal. In a general sense, each pin of the connector functions as a circuit node. Each program word designating a pin as an output, causes the voltage from the system under test appearing on this pin to be compared to the associated threshold to generate a signal representative of the logic state that exists on that pin at that moment. Similarly, the program words designating a pin as an input also specify the level (logic "one" or logic "zero") of the voltage to be coupled to the associated pin. Additionally, the voltage representing at least one of the logic level can be programmed.

The programmable test point selector circuit is composed entirely of solid state components resulting in a low noise, highly reliable and fast switching circuit which requires little physical space.

In general, it is not required that all outputs be measured during a given measurement period. Therefore, by selecting only those signals which are of interest during a particular measurement period, test time will be reduced.

In the preferred embodiment, the programmable test point selector circuit will be incorporated into the associated test set. However, as previously discussed, the programmable test point selector circuit may be a separate unit which serves as an adapter between the test set and the systems to be tested.

DESCRIPTION OF THE PREFERRED EMBODIMENT

Figure 1:
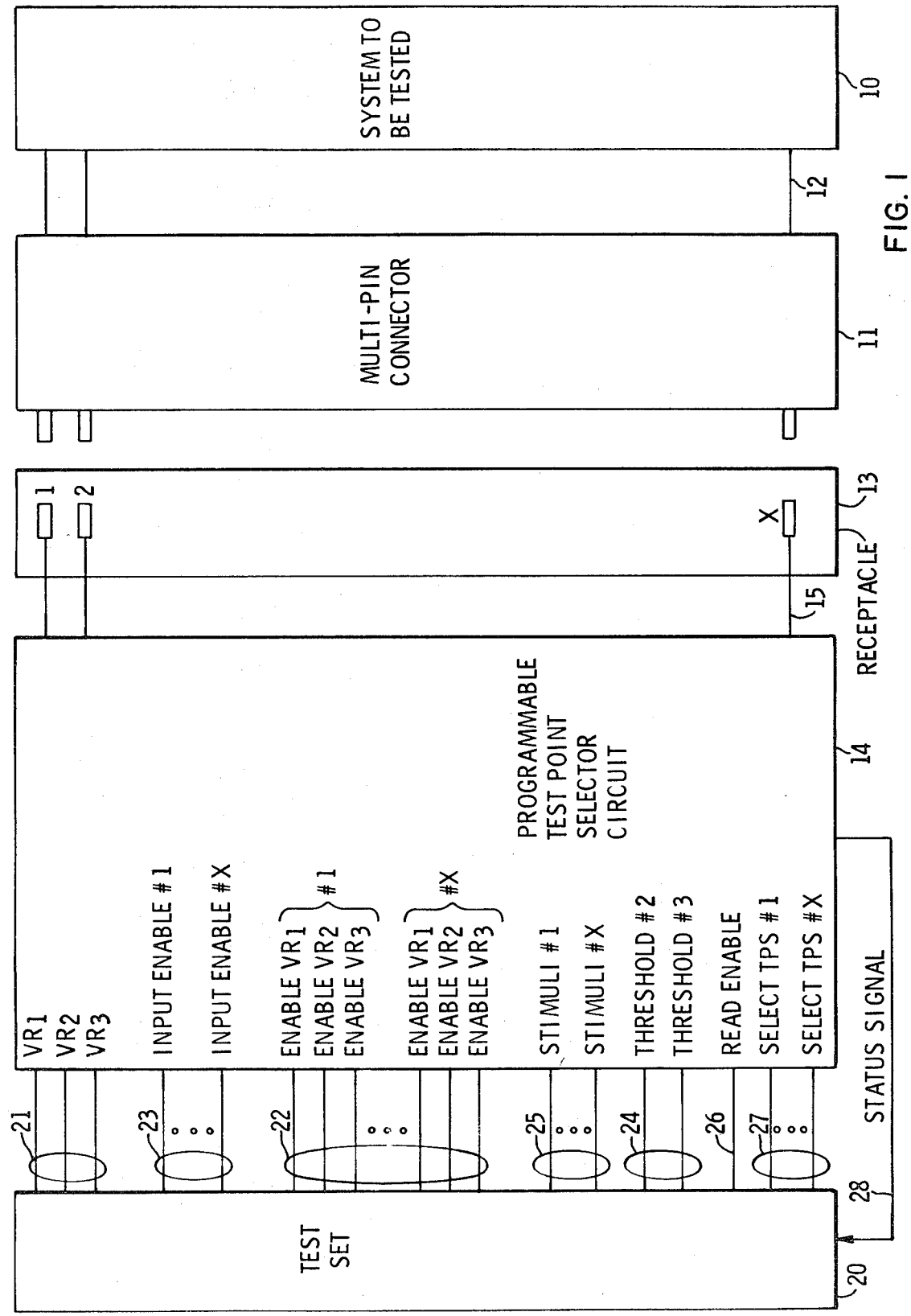
FIG. 1 is a block diagram illustrating the use of the programmable test point selector circuit.

FIG. 1 is a block diagram illustrating the programmable test point selector circuit 14 and its use to couple a general purpose test set 20 to a system 10 whose operational status is to be determined.

The system 10 to be tested is coupled to a multi-pin connector 11 by a cable 12. The multi-pin connector 11 usually is included in the system 10; however, in FIG. 1 the multi-pin connector 11 is shown as a separate item for clarity of illustration. Each pin of multi-pin connector 11 is coupled to the programmable test point selector circuit 14 through a receptacle 13 and a cable 15. Receptacle 13 will in general include a pin for each pin of multi-pin connector 11. Cable 15 includes a separate conductor for each pin of the multi-pin connector 11. In the preferred embodiment, receptacle 13 and cable 15 and the programmable test point selector circuit 14 are part of the test set 20. However, for purposes of simplicity, they are illustrated and will be discussed as separate units.

The test set 20 generates sequential multi-bit digital program words which are coupled to the programmable test point selector circuit 14 via cables 21 through 27. (Separate cables are used for grouping the bits of the digital program words to simplify later discussions.) Any pin of receptacle 13 and multi-pin connector 11 can be designated for use as either an input or an output during any step of the testing cycle by selecting the bit pattern of the associated digital program word. The positive level of the logic signal coupled to each pin specified as an input pin is selected by bits of the digital program words which are designated for this purpose. The number of voltage levels from which positive logic signals can be selected depends upon the design of the programmable test point selector circuit 14. Three levels are illustrated in the preferred embodiment, however, any reasonable number could have been selected.

The bits of the digital program word selecting the positive level of the logic signals are coupled from the test set 20 to the programmable test point selector circuit 14 by a cable 22. Similarly, the bits of the digital program word designating which pins of receptacle 13 are to be utilized as inputs is coupled from the test set 20 to the programmable test point selector circuit 14 by a cable 23. Selecting a pin as an input excludes its use as an output. Selected bits of the program words function as stimuli signals to designate the logic level ("zero" or "one") of the input signal to the pins of receptacle 13 are coupled from the test set 20 to the programmable test point selector circuit 14 by a cable 25. Status signals indicative of the status of the system 10 as determined by the amplitude of signals present on pins of receptacle 13 which have been designated as output pins are coupled to the test set 20 via a cable 28. Other bits of the programming word are coupled from the test set 20 to the programmable test point selector circuit 14 via cables 24, 26 and 27 to (1) select the threshold to which signals from the system being tested are compared, (2) enable selected output signals of the system being tested to be compared to the selected threshold signal, and (3) select which output pins of multi-pin connector 11 are to be monitored.

The system to be tested illustrated in FIG. 1 may, in general, be any digital system. The function of test set 20 is to generate the digital program words and stimuli signals. Multi-pin connector 11 is a conventional connector as described above. A schematic diagram of the preferred embodiment of the programmable test point selector circuit 14 is shown in FIG. 2 along with receptacle 13 and will now be described in detail.

Receptacle 13 and multi-pin connector 11 may contain any desired number of pins. For purposes of illustration, circuitry associated with two typical pins is illustrated in FIG. 2. Identical circuitry is utilized for each pin of receptacle 13. From the subsequent discussion it will also be clear that the number of bits in the digital programming word supplied by the associated test set 20 is directly related to the number of pins on receptacle 13.

Figure 2:
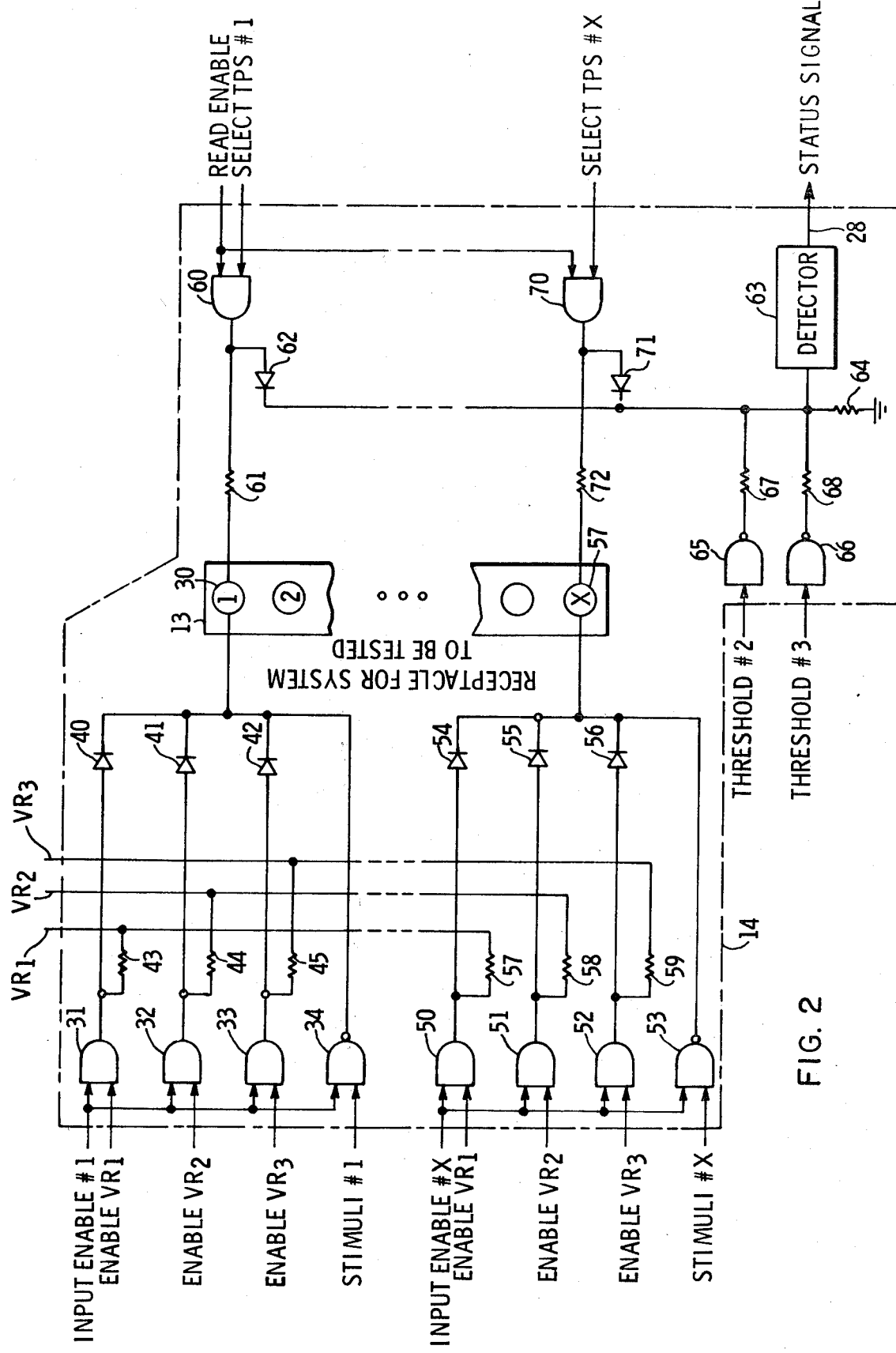
FIG. 2 is a schematic diagram of the programmable test point selector circuit.

The circuitry illustrated in FIG. 2 is designed to couple a digital input signal to each pin of receptacle 13 which has been designated as an input by the program word from test set 20. In the illustrated preferred embodiment the two levels of the digital input signal are either essentially zero volts or a selected positive voltage. However, the circuit can be easily adapted for digital signals having other voltage levels.

In the preferred embodiment illustrated, the positive voltage level of the digital input signal coupled to each of the pins designated as an input can have one of three values with the three values being determined by three positive reference voltages, which for purposes of convenience have been designated $VR_1$, $VR_2$ or $VR_3$. These reference voltages are coupled to the programmable test point selector circuit 14 via cable 21 as illustrated in FIG. 1. Only three reference voltages are illustrated; however, the programmable test point selector circuit 14 can be designed for any reasonable number of positive reference voltages. It will also be obvious to those skilled in the art that the circuit can be modified to utilize negative reference voltages; in which case the levels of the logic signals would be zero volts and a negative voltage determined by the selected reference voltage.

The illustrated reference voltage are selectively coupled to the first terminal 30 of receptacle 13 by a circuit consisting of four gates, illustrated as reference numerals 31–34, and three diodes, illustrated at reference numerals 40–42. The three AND gates, 31–33, are disabled except when both of the input signals are high (positive). The operation of this circuit will now be described in detail.

The first reference voltage, designated $VR_1$, is coupled to the output of AND gate 31 by resistor 43. The Input Enable #1 signal, consisting of a bit of the digital programming word from test set 20 (FIG. 1), is coupled to a first input of gates 31–34. When high, this bit designates that pin 1 of receptacle 13, illustrated as reference 30, is to be used for an input. The second inputs to gates 31 through 33 are three bits of the digital programming word which designate which reference voltage, $VR_1$ through $VR_3$, is to be used to determine the high level of the logic signal coupled to this pin. When the bit enabling reference voltage $VR_1$ is high, the combination of the two input signals to gate 31 turns off the output stage of this gate and permits the positive reference voltage $VR_1$ to be coupled by a resistor 43 and a diode 40 to pin 1 of receptacle 13 causing the voltage on this pin to rise to approximately $VR_1$, provided gate 34 is also turned off. The bits of the program word which enable reference voltages $VR_2$ and $VR_3$ are coupled to the second inputs of gates 32 and 33. These bits are low maintaining the output of these gates at essentially zero volts, reverse biasing diodes 41 and 42 and isolating reference voltages $VR_2$ and $VR_3$ from the first pin 30 of the receptacle 13. The Input Enable signal and the Stimuli #1 signal are coupled to one input of gate 34 to maintain the output stage of gate 34 in a non-conducting state when the Stimuli #1 signal is low, permitting the voltage at terminal 30 to rise to substantially $VR_1$ as discussed above. When the second or low level of the signal is desired to be coupled to pin 1 of receptacle 13, the Stimuli #1 signal to gate 34 is made high such that the output stage of this gate is conducting, causing the voltage coupled to pin 1 of receptacle 13 to be approximately zero volts. The value of resistors 43 through 45 is not critical; however, a fairly low value is desirable to provide a low source impedance and fast switching speeds. A value of one or two thousand ohms is a typical value. Gates 32 and 33 in conjunction with resistors 44 and 45 and diodes 41 and 42 function in an identical manner to selectively couple reference voltage $VR_2$ or $VR_3$ to pin 1 of receptacle 13.

A second identical circuit consisting of gates 50–53, resistors 57–59 and diodes 54–56 selectively couple voltages $VR_1$, $VR_2$, or $VR_3$ to pin X of receptacle 13, illustrated at reference numeral 57. This circuit is identical to the one previously described for pin 1 of receptacle 13, illustrated at reference numeral 30. A circuit of this type is included for each pin of receptacle 13. It is also clear that the circuit is not limited to three reference voltages as illustrated. The circuit is readily adaptable to one or more reference voltages. It is also clear, as previously discussed, that the circuit can be modified to utilize negative reference voltages. However, expanding the number of reference voltages requires that additional bits be included in the programming word to select the desired reference voltage.

If a pin of receptacle 13 is to be programmed as an output, for example the first pin illustrated at reference numeral 30, then the bit of the program word coupled to gates 31-34 as an input enable signal is made low thereby causing the output stages of gates 31-33 to be turned on, effectively isolating $VR_1$-$VR_3$ from pin 1 of receptacle 13 while the output of gate 34 is turned off. Gate 34 is turned off, effectively isolating the gate from the circuit because of its high output impedance in the off state.

The circuitry described above is that portion of the programmable test point selector circuit which applies the input signals to the system to be tested. The circuitry to be described next monitors or senses the status of the signal present on any pin of receptacle 13. This circuit can be used to monitor either the test signals applied to the system 10 to be tested, or to monitor output signals of the system being tested or both. Since this circuit can be used to determine the status of the voltage on any pin of receptacle 13 during any portion of the test cycle, its operation may be thought of as independent of the circuitry previously described for applying input signals to the system being tested.

The Read enable bits of the program word used to designate when a measurement is to take place are coupled from test set 20 to the first input terminal of gates 60, 70, and all other gates in that string. A select test point signal comprising bits of the program word is coupled from the test set 20 (FIG. 1) to the second input of gates 60 through 70. These bits are selected such that both of the input signals to only one of the gates 60 through 70 will be high at any point in time. Any gate having both of its inputs high turns off the output stage of the gate, permitting the voltage at the associated pin of receptacle 13 to be coupled to the input of detector 63. For example, when the voltage at pin 1 of receptacle 13, illustrated at reference number 30, is to be sensed, the bits of the program word are selected such that a high level signal is coupled to both inputs of gate 60. This causes the output stage of gate 60 to switch to a non-conducting state, thereby essentially removing gate 60 from the circuit permitting the voltage on the first pin 30 of receptacle 13 to cause a small current to flow through resistor 61 and diode 62 and then to divide between resistor 64 and the input of detector circuit 63 to produce a voltage signal at the input of detector 63. The first detector threshold is therefore determined by the ratio of the value of resistor 64 to the detector input impedance. This assumes the outputs of both gates 65 and 66 are non-conducting isolating resistors 67 and 68 from the circuit.

The second input to gate 60 is held high only during the time when the voltage on first pin of receptacle 13, illustrated at reference numeral 30 is to be compared to the selected threshold. At all other times it is held low. In this latter case, the output stage of gate 60 is conducting, essentially grounding the junction of resistor 61 and diode 62. No substantial current flows from terminal 30 into the detector circuit and essentially all measurement circuitry is removed from pin 1 of receptacle 13 due to the large value of resistor 61 (typically on the order of 50,000 ohms).

The second measurement circuit shown consisting of gate 70, resistor 72 and diode 71, performs identical functions for pin X of receptacle 13, illustrated at reference numeral 57. Each pin of receptacle 13 has a similar measurement circuit but one detector circuit 63 is common to all pins. The diodes prevent the current from the selected pin from flowing into other pins and confine it to the detector input circuitry and resistor 64. The series resistors 61, 72, are made sufficiently large not to disturb the circuitry of the device being tested, a value of 50,000 ohms being typical as noted above.

With no terminals selected as measurement points, the entire measurement circuit is essentially disconnected from receptacle 13 and the system being tested. Thus, it is seen that the measurement circuit does not supply current to the system being tested, but rather a small amount of current is extracted from the system under test to perform the measurement. Therefore, a voltage must be present at the terminal of the system under test for the detector to operate, and elements under test with faulty open output circuits will not go undetected.

Measurement is performed in a serial fashion rather than in the usual parallel manner. Only one terminal pin is selected at any given time. That is, each pin is inspected individually in a step-by-step sequence. This approach has several advantages. The circuit can be programmed to measure individual points or selected sequential groups of points, for example points 27 through 53. Thus, less data is returned to the test set 20 (FIG. 1) for analysis, an especially important feature if the information is transmitted over long-distance data channels. (This may occur when the test set 20 is controlled by a remote computer or the test set 20 is remotely located.) Additionally, only one detector is required. In the parallel method, a detector or sensor is required at each pin. A single detector gives uniform results for all measurements while multiple detectors may provide varying indications.

The detector circuit can be programmed for various thresholds utilizing circuits consisting of gates 65 and 66 and resistors 67 and 68. When a threshold gate is enabled (turned on), for example gate 65, by making its "threshold 2" (input signal) high, resistor 67 is connected to ground in shunt with resistor 64, thereby changing the threshold point of the detector. Consequently, the circuit can be used to inspect circuits having a mixture of output voltage levels. That is, the threshold can be switched to various values as the signals appearing on various pins of receptacle 13 are sequentially measured. The inputs to gates 65 and 66 are the bits of the programming word which select the threshold to which the voltage on a given pin must exceed in order to be correct.

The signal at the output of the detector is coupled to the test set 20 (FIG. 1) where it is compared in a conventional manner with expected logic states stored in the test set 20.

As an example of the threshold select circuit operation, consider the case where the system to be tested has three possible levels of voltages at its output terminals. These three levels are required to be (1) equal to or greater than +2 volts, (2) equal to or greater than +7 volts, and (3) equal to or greater than +15 volts. The detector thresholds would be set for these values by adjusting the values of resistors 64, 67 and 68. Resistor 64 is adjusted such that a +2 volt signal at any selected pin of receptacle 13 would produce a high level indication at the detector 63 output terminal while gates 65 and 66 were turned off. When "threshold 2" is enabled, resistor 67 shunts resistor 64 and is adjusted in value such that a +7 volt signal on any selected pin will produce a high level indication at the detector 63 output. In a like manner, resistor 68 is adjusted for a +15 volt signal. Should the selected pin have a voltage which is incorrectly low and less than that of the selected threshold level, the detector output will remain in the low-level state, and the status signal returned to the test set will indicate an error which will be recognized by the test set.

Only two threshold gates and resistors are shown in FIG. 2; however, any number of separate thresholds can be provided in this measurement circuit.

It is to be noted that the illustrated circuit can also be used to verify that the correct stimuli signals have been applied to all input pins as well as to perform its primary function of measuring the output signals of the system being tested. This results from the measurement circuit being separate and independent of the input circuitry.

The measurement circuit described above permits the signal appearing on any pin of connector 11 to be compared one at a time to predetermined thresholds to determine if the signal is within prescribed limits. If it is desired to simultaneously compare the voltage on one or more pins to predetermined thresholds, it is obvious that detector 63, the threshold selector gates 65 and 66, as well as the enable gate 60 can be independently repeated for the pins to be examined in parallel. It is also obvious that additional threshold gates can be included if it is desired to compare a terminal to more than three thresholds.

From the above discussion, it is obvious that the program words consist of distinct portions which control the input enable, reference select, stimuli, threshold select, read enable and test point select functions. All of these functions, except the "stimuli signals" may be thought of as initial conditions or set-up commands. These initial conditions or set-up commands may be stored in memories at the start of a test cycle. Under these circumstances, after the initial conditions have been set, it is only necessary to change the stimuli signals as the test set cycles through the prescribed test sequence.

We claim:

1. A programmed circuit for selectively coupling a multi-bit digital signal to a plurality of circuit nodes and for determining the status of signals present at said nodes; comprising:
   (a) a plurality of input circuits, each of said input circuits selecting which ones of said nodes the bits of said digital signal will be coupled to and generating a bit of said digital signal, each of said input circuit comprising a first plurality of two input AND gate circuits having their respective output terminals coupled to a plurality of voltage sources by a first plurality of resistors;
   (b) a first plurality of diodes each having first and second polarity terminals, said first plurality of diodes having their first polarity terminals connected in parallel and to one of said nodes, said second polarity terminal of each of said diodes being coupled to the output terminal of separate ones of said first plurality of two input AND gates;
   (c) a plurality of two input NAND gates each having its output coupled directly to said one and only one of said nodes;
   (d) a threshold detector circuit;
   (e) a second plurality of diodes each having first and second polarity terminals, said second plurality of diodes having their second like polarity terminals connected in parallel and to the input of said threshold detector;
   (f) a second plurality of resistors each having first and second terminals, each of said second plurality of resistors having its first terminal coupled to one and only one of said terminals of said first polarity of said second plurality of diodes, said second terminal of each of said second plurality of resistors being coupled to one and only one of said nodes;
   (g) a second plurality of two input AND gates, each of said second plurality of AND gates having its output terminal coupled to the junction formed by separate ones of said second plurality of diodes and said second plurality of resistors, with the inputs of said first and second plurality of AND gates and the input to said NAND gate coupled to receive a digital program signal which specifies to which ones of said circuit nodes the bits of said digital signal will be coupled and which one of said nodes will be coupled to the input of said detector to determine the status of the signal thereon.

2. A circuit in accordance with claim 1 further including at least one resistor coupled between the input of said detector circuit and the output of a threshold gate circuit such that the impedance between the input changes to change the threshold of said detector circuit, depending on the logic state of a digital input signal to said theshold gate circuit.

* * * * *